Jan. 14, 1958 S. T. MARTIN 2,819,513

SEMI-CONDUCTOR ASSEMBLY AND METHOD

Filed Nov. 3, 1953

INVENTOR.

Stuart T. Martin

BY Rowland J. Patrick

ATTORNEY

United States Patent Office 2,819,513
Patented Jan. 14, 1958

2,819,513

SEMI-CONDUCTOR ASSEMBLY AND METHOD

Stuart T. Martin, Winchester, Mass.

Application November 3, 1953, Serial No. 390,067
5 Claims. (Cl. 29—25.3)

This invention relates to semi-conductor elements and to methods for mounting them. More particularly it relates to methods of manufacturing a semi-conductor mount assembly for use in electrical devices in which one of the elements is a semi-conductor material such as silicon or germanium, and the other element is usually a rectifying contact.

One form of semi-conductor devices has been manufactured by cutting a prepared sheet or wafer of semi-conductor material into a number of very small thin squares or dice and individually soldering each small square to a metallic supporting pin. The mounted semi-conductor material was then further processed in some instances so as to be suitable for final assembly operations. When assembled, a particular form of such a semi-conductor device comprised a supporting or mounting base pin with the semi-conductor material mounted thereon, and a sharp fine wire in endwise contact with the semi-conductor material, all within a protective supporting enclosure as of glass or similar material. Conventional electrical leads are connected to both the metal point contact and the supporting pin and extend through the enclosure. A difficult and time consuming step in the assembly of the device is the mounting of each minute and individual square of semi-conductor material upon its supporting pin, and with the earlier mounting methods, due to the very small size of the components, it has been a slow and tedious hand operation properly to solder the supporting pin to a small piece of semi-conductor material and at the same time secure proper alignment of the components.

Attempts have been made to solve the problem of hand mounting of the semi-conductor material by assembling a plurality of mounting pins in hexagonal arrangement, then soldering or otherwise attaching a sheet of semi-conductor material to the ends of the assembled pins, and finally cutting away the interconnecting semi-conductor material in an equilateral triangular pattern.

Such method, though far superior to hand mounting methods, has a number of disadvantages, the major of such disadvantages being that there are left between the resulting separated hexagonal portions of semi-conductor material on the ends of the pins small free triangular portions of uncut semi-conductor material which are known to foul the cutting wheels and thus interfere with or prevent the production of the desired product. These triangular pieces can only be eliminated by making an extremely wide cut, and with such a wide cut the resulting hexagonal germanium wafer becomes extremely small.

Accordingly, it is a major object of the present invention to provide a method for mounting semi-conductors in which the cut sheet will have no such free triangular portions unsecured to the supporting pins and yet a method which at the same time will result in the production of germanium wafers having a substantial area.

A further object of the invention is to provide a method for mounting semi-conductors whereby the semi-conductor elements are quickly and accurately aligned upon their supports without employing highly skilled and trained assemblers.

Still another object of the invention is to provide a method for mounting semi-conductors requiring fewer steps than in heretofore methods.

For better understanding of preferred embodiments of the invention, together with further objects and features thereof, reference is made to the following detailed description taken in connection with the accompanying drawings in which.

Figures 1, 2, 3, 4, 5, 6:
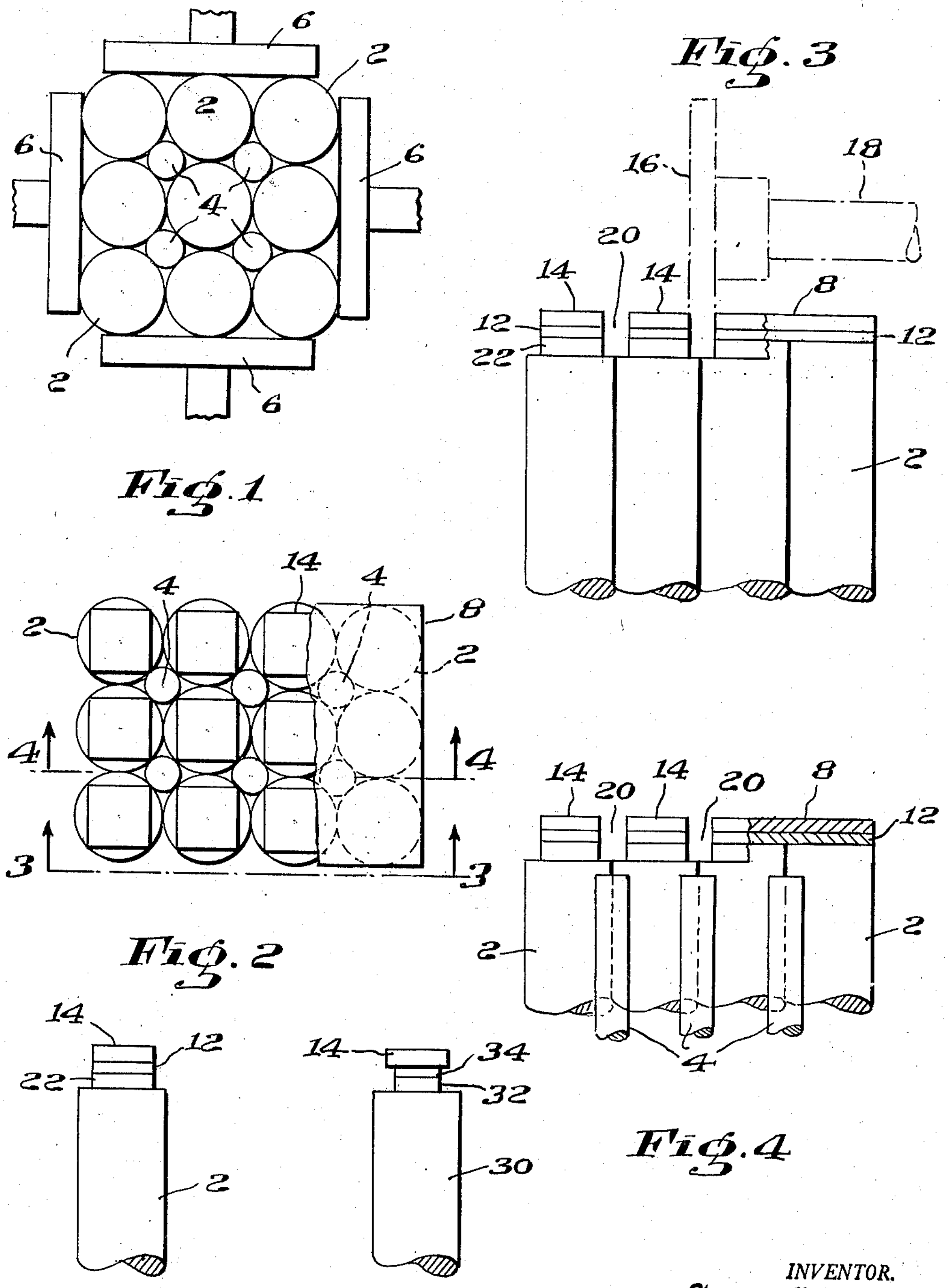
Fig. 1 is a top view of a number of supporting pins assembled and maintained in right angular arrangement.
Fig. 2 shows the pins in elevation after a partial cutting step in the preparation of the semi-conductor mount assembly.
Fig. 3 is a side view of the semi-conductor mount assembly of Fig. 2 taken on the line 3—3 of Fig. 2.
Fig. 4 is a side view of the semi-conductor mount assembly of Fig. 2 taken on the line 4—4 of Fig. 2.
Fig. 5 shows a finished semi-conductor assembly in elevation as manufactured in accordance with the method of Figs. 1 through 4.
Fig. 6 shows a finished semi-conductor assembly in elevation as manufactured in accordance with a slightly modified method.

Although the mounting method is described herein as applying to germanium, it is understood that the method may be employed to mount a wide variety of semi-conductor materials including silicon and is not limited to germanium. Similarly, the invention will be recognized as being adapted equally well to the manufacture of other forms of semi-conductor devices such as to multiple rectifying contact transistors as well as to point contact rectifiers.

In Figs. 1 through 4 a number of supporting base pins 2 are shown upon which the germanium is to be mounted, such pins being assembled with separating pins 4 of a particular diameter and clamped by jaws 6 so that when the whole assembly is compressed, the base pins will automatically fall into an array having fourfold right angular symmetry. The base pins 2 are of a type conventionally used in a well-known form of rectifier to support small pieces of semi-conductor material when used in conjunction with point contacts or "cat whiskers." For example, the supporting pins may be fabricated of nickel wire and are of the order of 0.05 inch in diameter. Although cylindrical pins are preferably utilized as a supporting base for the germanium, other bases such as octagonal metallic pins may be used satisfactorily where the envelope of the finished device is designed for such pins.

To secure portions of germanium to a large number of supporting base pins, a large number of short lengths of such pins are preferably first prepared by coating an end of each with a cap of conventional solder. Alternatively, the pins may be tin plated or other suitable tinning methods may be used. As a still further alternative, the semi-conductor to be secured may itself be tinned or solder coated.

According to the present invention, a large number of the circular tinned pins 2, together with the separating pins 4 are then arranged in an upright position between the jaws 6 of a four-jaw clamp. The jaws are of sufficient height and are preferably suitably disposed so as to define a rectangular enclosure between the face of the jaws 6. By arranging the pins 2 in a rectangular pattern having fourfold symmetry and providing circular spacing pins 4 therebetween to provide a mechanically stable pattern, I am enabled to provide separately mounted germanium pieces of maximum area by making cuts in but two directions at right angles to one another without danger of fouling the cutting wheel. The separating pins 4 may be of shape other than circular; for example, square or octagonal supporting pins will operate as well.

The circular separating pins necessary to give a stable mechanical assembly should be of a diameter related to that of the supporting pins. Such diameter, assuming a diameter D of the supporting pins, is equal to $D(\sqrt{2}-1)$ which is approximately equal to 0.41D. Also it is preferable that the separating pins 4 be shorter than the supporting pins 2, that is, that the separating pins be spaced below the plane of the ends of the supporting pins. It is also desirable that the separating pins be of a material that will not readily be soldered to the germanium wafer or the supporting pins, tungsten being satisfactory for the purpose.

The faces of the jaws 6 are of sufficient vertical height to provide a firm support against which the supporting pins may rest and be held securely in an upright position. Preferably at least two of the jaws should be made movable in order to seize the assembled supporting pins 2 and separating pins 4 loaded into the enclosure so that the pins will be securely held in a rectangular pattern. Before the jaws are tightened, the supporting pins 2 should be adjusted to equal height as by resting the exposed end surface of the pins against a flat plate or by holding a flat plate against the pin ends and tapping the plate. I also prefer that the ends of the spacing pins 4 be spaced below the ends of supporting pins 2 upon which a germanium sheet is to be mounted.

A sheet of germanium 8 is next prepared for soldering and mounting to the cluster of supporting pins 2. The sheet of germanium of approximately 0.005 inch thickness, for example, is cut from a solid ingot of material, suitably a single crystal ingot. It is ground flat and polished, advantageously plated with copper or the like to facilitate soldering it to the supporting pins 2 and to provide a low resistance non-rectifying ohmic contact therebetween. The opposite side of the wafer is specially prepared for rectification, as by etching, washing, and drying conventionally. The plated wafer 8 is then placed upon the upper end surfaces of the grouped supporting base pins 2 in such a manner that the plated surface is in contact with the tinned end surface 12 of the pins. The pins may be flux coated at this stage to facilitate soldering. The clustered pins are heated gently until the tinned end surfaces are soldered to the plated surface of the wafer 8 thereby firmly securing the slab of germanium 8 to the cluster of supporting pins 2 upon cooling. The drawing symbolically shows relatively few pins. When it is considered that a wafer may be of an inch or more in diameter and the supporting pins 2 are only 0.05 inch, it will be seen that hundreds of pins may be involved. The supporting pins 2 are then detached from one another by dividing the wafer into square pieces 14 so that each piece 14 is mounted on an associated pin 2.

According to this invention, the preferred form of dividing may be effected by making two series of successive parallel cuts 20 at right angles to one another through the semi-conductor sheet 8 and so positioned as to be centered over the lines determined by the centers of adjacent separating pins. These cuts are preferably made by means of a metallic cutting wheel 16 charged with diamond particles and rotated by a suitable driven shaft 18 as shown in Fig. 3. In order to provide a cut of minimum width and to be sure of complete separation of the germanium sheet without the production of particles which might foul the cutting wheel 16, I have found that the width W of the cut should be equal to $D(1-1\sqrt{2})$ taken with its center line along the centers of the separating pins 21, such width being approximately equal to 0.29D. With a cut 20 of such width the germanium sheet 8 will be completely separated into square pieces 14, each mounted on a supporting pin 2 and, with the use of supporting pins 4 of a length sufficient to contact the bottom of the germanium sheet, such a cut is wide enough to completely remove the ends of such pins. With a width of cut as defined above, the width of the germanium piece 14 mounted on said pins will be equal to $D\sqrt{2}$, that is, the diagonal of such square pieces will be equal to the diameter D of the supporting pins 2. Although a cut of width as defined above is desirable as a minimum dimension, wider cuts may be made if so desired, it being understood that the wider the cut made the smaller will be the dimensions of the resulting germanium piece 14 mounted on a supporting pin 2. Although it is preferable that the germanium areas be separated with a diamond wheel, any other suitable means for providing a cut of the desired width can be used.

To insure that no portion of a germanium piece 14 is left to extend beyond the outer periphery of a supporting pin 2, the saw cut or slot 20 is made sufficiently deep so as to pass through both the semi-conductor slab 8, the tinned layer 12, and a short distance into the body of supporting pin 2. Thus, when the pins 2 are separated, each will have formed therein a neck portion 22 whose length and width will be determined by the thickness of the diamond wheel 16 and the depth of the saw cut 20, the minimum width of cut as defined above being substantially the minimum desirable thickness of said diamond wheel. When prepared as described, each completed mount assembly will have the exposed surface of its piece 14 of semi-conductor material accurately disposed perpendicular to and centrally of its supporting pin 2.

In some instances difficulty may be encountered in successfully utilizing the above described mounting method due to the collection of particles of soft solder from the tinned pin end layer 12 on the diamond saw 16, since such solder has a tendency to stick to the abrasive surface of said wheel. To prevent the possibility of this occurrence, in a modified embodiment of my invention (Fig. 6) pins 30 having a pre-necked end 32 with a layer of solder 34 thereon may be employed and such pins may be necked either by conventional screw machine methods and then tinned, or they may be pre-necked by cutting methods when clamped in a clamp as hereinbefore described. For example, if such pins 30 are clamped in rectangular configuration with supporting pins 4, the neck portion 32 with its solder coating 34 may be provided by making a preliminary cut of a greater width than the cut for separating the germanium sheet 8 into pieces 14. The completed mount of the preferred embodiment as shown in Fig. 5 has a small piece or die 14 of square configuration soldered to a square neck portion of cross-sectional area identical with that of supporting pin 30. The completed mount in the modified embodiment as shown in Fig. 6 has a square piece of germanium 14 soldered to the end of a reduced neck portion 32 of pin 30, such square piece extending beyond said neck portion. If the neck portion is made by pre-cutting while the pins 30 are clamped in rectangular configuration followed by a second cut of narrower width after the germanium sheet has been soldered to the pins, the neck portion will also be square, whereas if the pin 30 is a product of conventional screw machine processes, the neck 32 will be cylindrical. In any event the square piece of germanium 14 cannot extend beyond the outer periphery of its supporting pin if the width W of the cut is greater than the minimum width as defined above. This is a desirable feature as some applications of the devices may require that the whole assembly be able to pass through passages in a suitable holder whose diameters are only slightly larger than that of a supporting pin.

While the present invention has been disclosed by means of specific illustrative embodiments thereof, it will appear to those skilled in the art that various changes and modifications in the methods described or in the resulting product may be made without departing from the spirit or scope of the invention as defined in the appended claims.

I claim:

1. A method for mounting semi-conductors on bases, including interposing separating pins between the individual members of a cluster of base pins to provide a configuration of four-fold symmetry of said base pins fastening a sheet of semi-conductor material to the ends of said base pins, and dividing said sheet into separate pieces each secured to a respective base pin.

2. A method as claimed in claim 1 in which the ends of said base pins to which said sheet is fastened are in a plane spaced from the ends of said separating pins.

3. A method as claimed in claim 1 in which said separating pins are of a diameter at least as great as 0.41 times the diameter of said base pins.

4. A method for mounting semi-conductors on bases, including interposing separating pins between the individual members of a cluster of base pins to provide a configuration of four-fold symmetry of said base pins, fastening a sheet of semi-conductor material to the ends of said base pins, and cutting the sheet into areas of square configuration, each area lying above a respective base pin.

5. A method as claimed in claim 4 including cutting said sheet along the center lines of said separating pins, said cut being of a width at least as great as 0.29 times the diameter of the base pins and centered on said lines.

References Cited in the file of this patent

UNITED STATES PATENTS

| | | |
|---|---|---|
| 2,359,377 | Miller et al. | Oct. 3, 1944 |
| 2,597,734 | James et al. | May 20, 1952 |
| 2,626,985 | Gates | Jan. 27, 1953 |
| 2,632,042 | Fitchett | Mar. 17, 1953 |
| 2,713,133 | Ostapkouich | July 12, 1955 |
| 2,762,954 | Liefer | Sept. 11, 1956 |